United States Patent
Celik et al.

(10) Patent No.: US 12,283,416 B2
(45) Date of Patent: Apr. 22, 2025

(54) SWITCH ASSEMBLIES OF SUPERCONDUCTING MAGNET ASSEMBLIES AND RECONFIGURABLE SUPERCONDUCTING MAGNET ASSEMBLIES OF A CRYOGENIC SYSTEM

(71) Applicant: GE PRECISION HEALTHCARE LLC, Wauwatosa, WI (US)

(72) Inventors: Dogan Celik, Florence, SC (US); Stuart Paul Feltham, Florence, SC (US); Charles D. Yarborough, Florence, SC (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 199 days.

(21) Appl. No.: 17/969,024

(22) Filed: Oct. 19, 2022

(65) Prior Publication Data
US 2024/0136097 A1 Apr. 25, 2024
US 2024/0233995 A9 Jul. 11, 2024

(51) Int. Cl.
*H01F 6/04* (2006.01)
*F16K 31/126* (2006.01)

(52) U.S. Cl.
CPC ............. *H01F 6/04* (2013.01); *F16K 31/126* (2013.01)

(58) Field of Classification Search
CPC .......... F16K 31/126; H01N 60/30; H01F 6/04
See application file for complete search history.

(56) References Cited

U.S. PATENT DOCUMENTS

| | | | |
|---|---|---|---|
| 7,170,377 B2 * | 1/2007 | Jiang | F25D 19/006 324/318 |
| 7,497,086 B2 * | 3/2009 | Atkins | G01R 33/3804 62/50.1 |
| 7,509,815 B2 | 3/2009 | van Hasselt | |
| 8,643,367 B2 * | 2/2014 | Huang | G01R 33/3804 324/318 |
| 8,922,308 B2 | 12/2014 | Stautner | |
| 9,074,798 B2 | 7/2015 | Ackermann et al. | |
| 9,396,855 B2 * | 7/2016 | Tamura | H01F 6/00 |
| 9,459,332 B2 * | 10/2016 | Harrison | H01F 6/04 |
| 9,958,519 B2 | 5/2018 | Stautner | |
| 9,966,173 B2 * | 5/2018 | Oka | H01F 6/065 |
| 10,002,697 B2 * | 6/2018 | Oka | H01F 6/06 |

(Continued)

FOREIGN PATENT DOCUMENTS

GB 2463659 A 3/2010

*Primary Examiner* — Umashankar Venkatesan
(74) *Attorney, Agent, or Firm* — Armstrong Teasdale LLP

(57) ABSTRACT

A superconducting magnet assembly is provided. The magnet assembly includes a magnet and a switch assembly coupled to the magnet. The switch assembly includes a thermosyphon tube configured to carry cryogen therethrough, a switch, a first pressure valve, and a second pressure valve. The switch is configured to switch between a resistive mode and a superconducting mode, wherein the switch is in thermal contact with the thermosyphon tube. The first pressure valve and the second pressure valve are positioned on the thermosyphon tube and configured to control flow of the cryogen in the thermosyphon tube, and the switch is positioned between the first pressure valve and the second pressure valve. The magnet is configured to generate a polarizing magnetic field based on switching of the switch between the resistive mode and the superconducting mode.

15 Claims, 8 Drawing Sheets

(56) References Cited

U.S. PATENT DOCUMENTS

| | | | |
|---|---|---|---|
| 10,041,720 B2* | 8/2018 | Simpkins | G01R 33/3815 |
| 10,712,077 B2* | 7/2020 | Johnstone | G01R 33/3815 |
| 10,775,455 B2* | 9/2020 | Koeber | H01F 6/006 |
| 11,309,110 B2* | 4/2022 | Mine | G01R 33/3804 |
| 11,469,021 B2* | 10/2022 | Chorley | H01F 6/065 |
| 11,619,691 B2 | 4/2023 | Wu | |
| 11,994,569 B2* | 5/2024 | Legall | G01R 33/34007 |
| 2006/0266053 A1* | 11/2006 | Jiang | G01R 33/3815 |
| | | | 62/51.1 |
| 2008/0209919 A1 | 9/2008 | Ackermann | |
| 2015/0080222 A1* | 3/2015 | Kwon | G01R 33/3804 |
| | | | 335/216 |
| 2015/0380137 A1 | 12/2015 | Tamura | |
| 2016/0061382 A1 | 3/2016 | Simpkins | |
| 2016/0180996 A1 | 6/2016 | Wu et al. | |
| 2020/0348379 A1 | 11/2020 | Wu | |
| 2023/0046818 A1* | 2/2023 | Ikeya | F25B 9/14 |
| 2024/0136098 A1* | 4/2024 | Celik | G01R 33/3815 |

* cited by examiner

SWITCH ASSEMBLIES OF SUPERCONDUCTING MAGNET ASSEMBLIES AND RECONFIGURABLE SUPERCONDUCTING MAGNET ASSEMBLIES OF A CRYOGENIC SYSTEM

BACKGROUND

The field of the disclosure relates generally to systems and methods of magnet assemblies, and more particularly, to systems, assemblies, and methods of superconducting magnet assemblies.

A cryogenic system includes a cryogenic apparatus such as a superconducting magnet for a magnetic resonance imaging (MRI) system, superconducting transformers, generators, and electronics. The cryogenic apparatus is cooled by keeping the magnet in contact with a cooling source such as liquid helium such that the cryogenic apparatus operates in a superconducting condition. To reach a certain operating status, electric power is provided to the cryogenic apparatus. For example, to ramp up a superconducting magnet of an MRI system to a certain magnetic field strength (e.g., 1.5 Tesla (T)), electrical power is provided from a power supply to the superconducting magnet to generate a magnetic field from the electric current. Once the amount of current for the field strength is reached, the magnet is switched to operate in a superconducting mode, via a switch assembly. Known switch assemblies are prone to certain problems, and improvements are needed.

Superconducting magnet assemblies are categorized into two types of systems, an open system and a sealed system. Both systems are disadvantaged in some aspects and improvements are desired.

BRIEF DESCRIPTION

In one aspect, a superconducting magnet assembly is provided. The magnet assembly includes a magnet and a switch assembly coupled to the magnet. The switch assembly includes a thermosyphon tube configured to carry cryogen therethrough, a switch, a first pressure valve, and a second pressure valve. The switch is configured to switch between a resistive mode and a superconducting mode, wherein the switch is in thermal contact with the thermosyphon tube. The first pressure valve and the second pressure valve are positioned on the thermosyphon tube and configured to control flow of the cryogen in the thermosyphon tube, and the switch is positioned between the first pressure valve and the second pressure valve. The magnet is configured to generate a polarizing magnetic field based on switching of the switch between the resistive mode and the superconducting mode.

In another aspect, a switch assembly of a superconducting magnet assembly is provided. The switch assembly includes a thermosyphon tube configured to carry cryogen therethrough, a switch, a first pressure valve, and a second pressure valve. The switch is configured to switch between a resistive mode and a superconducting mode, wherein the switch is in thermal contact with the thermosyphon tube. The first pressure valve and the second pressure valve are positioned on the thermosyphon tube and configured to control flow of the cryogen in the thermosyphon tube, and the switch is positioned between the first pressure valve and the second pressure valve.

In one more aspect, a pressure valve is provided. The pressure valve includes a metallic valve head defining a gas chamber, a metallic bellows assembly, and a plunger. The bellows assembly is coupled with the valve head and in communication with the valve head. The plunger extends from the bellows assembly and is moveable between a first position and a second position farther away from the bellows assembly than the first position via a pressure change in the gas chamber. The pressure valve is fabricated with a non-magnetic material and configured to operate in a cryogenic environment and with presence of a magnetic field.

DRAWINGS

Non-limiting and non-exhaustive examples are described with reference to the following figures, wherein like reference numerals refer to like parts throughout the various drawings unless otherwise specified.

DETAILED DESCRIPTION

The disclosure includes switch assemblies of superconducting magnet assemblies, and superconducting magnet assemblies including reconfigurable superconducting magnet assemblies. Superconducting magnet assemblies for a magnetic resonance (MR) system is described as an example for illustration purposes only. Switch assemblies and superconducting magnet assemblies described herein may be used in superconducting magnet assemblies for other systems, such as superconducting transformers, generators, and electronics. Method aspects will be in part apparent and in part explicitly discussed in the following description.

Figure 1:
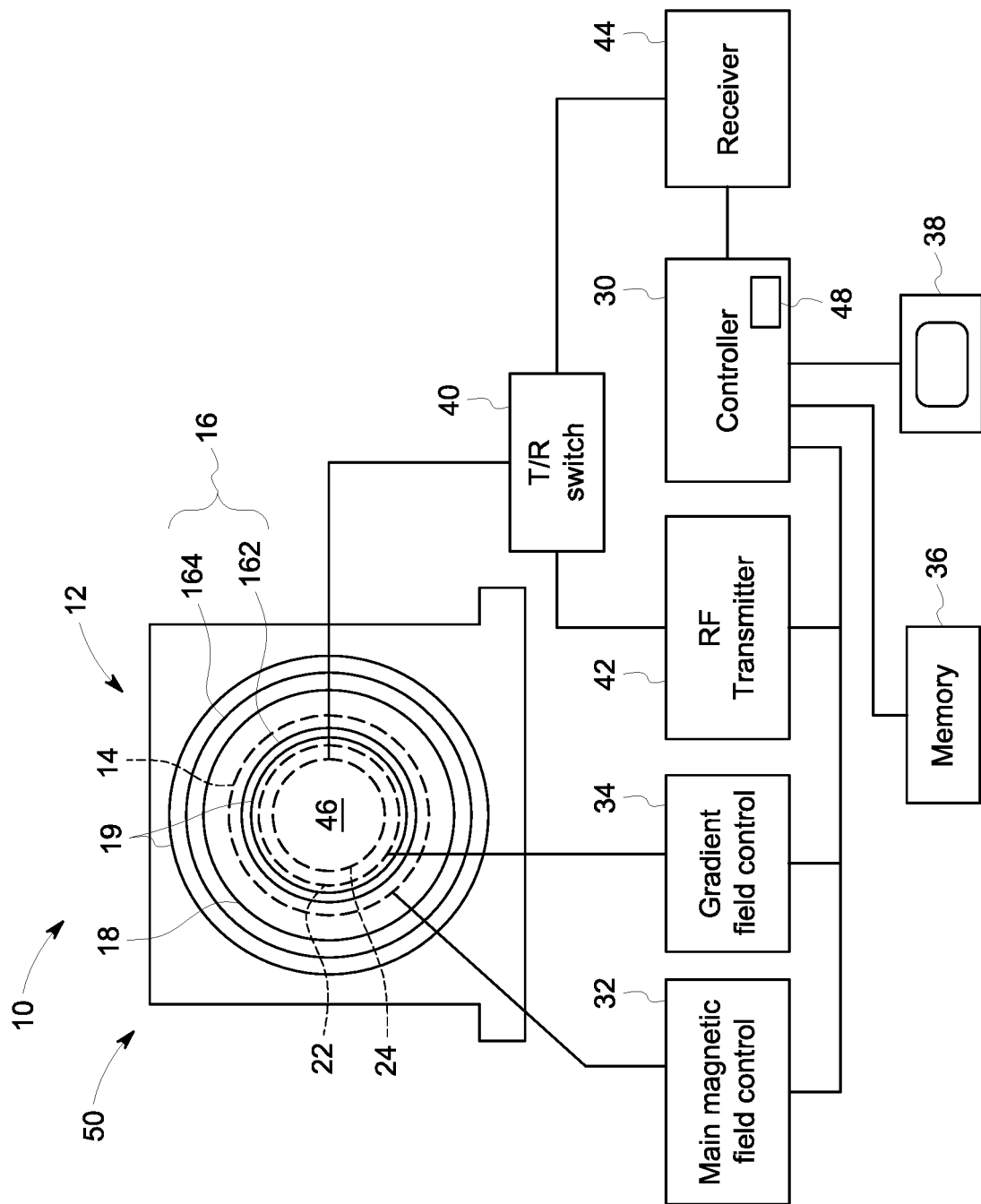
FIG. 1 is a schematic diagram of an example magnetic resonance (MR) system.

FIG. 1 illustrates a schematic block diagram of an example MR system 10. MR system 10 is used to obtain images or for spectroscopy applications of a subject.

In the example embodiment, MR system 10 includes a magnet assembly 12 that includes a magnet 14. In some embodiments, magnet 14 is a superconducting magnet formed from a plurality of magnetic coils wound around a magnetic coil support or a coil former. Magnet 14 is configured to generate a polarizing magnetic field. Magnet assembly 12 may include a cryostat vessel 18 that surrounds magnet 14. Cryostat vessel 18 is typically filled with a cryogenic fluid or cryogen which is used to cool the superconducting coils into an extremely low temperature, e.g., 4 K, such that electric current continues to flow through the superconducting coils without electrical resistance to maintain a uniform and static magnetic field after a power supply is disconnected. Cryogen may be helium, hydrogen, neon, nitrogen, or any combination thereof, in a liquid form, a gaseous form, or a combination of liquid and gaseous form. Helium is described as an example cryogen. Other cryogen may be used in superconducting magnet assemblies described herein.

In the example embodiment, magnet assembly 12 may also include a thermal shield assembly 16 that enclose cryostat vessel 18 and magnet 14 therein. In one embodiment, thermal shield assembly 16 may include an inner thermal shield member 162 and an outer thermal shield member 164. Inner thermal shield member 162 is generally cylindrical in shape and is radially placed inside of magnet 14. Inner thermal shield member 162 is configured to prevent heat being radiated from a warm region where the subject is placed to a cold region where magnet 14 is placed. Outer thermal shield member 164 is arranged concentrically with respect to inner thermal shield member 162. Outer thermal shield member 164 may also have a generally cylindrical shape and is radially placed outside of magnet 14. Outer thermal shield member 164 is configured to prevent heat being radiated from environment into magnet 14. Thermal shield assembly 16 is made from metal materials, such as aluminum, In some embodiments, magnet assembly 12 may also include a magnet vacuum vessel 19 surrounding thermal shield assembly 16 and insulating magnet 14 from the environment during operation.

In the example embodiment, MR system 10 also includes a gradient coil assembly 22 placed inside of inner thermal shield member 162. Gradient coil assembly 22 is configured to selectively impose one or more gradient magnetic fields along one or more axes, such as x, y, or z axes. MR system 10 also includes RF coil 24. RF coil 24 may be a transmitter coil, which is configured to transmit RF pulses. RF coil 24 may be a receiver coil, which is configured to detect MR signals from the subject. RF coil 24 may be a transmit and receive coil that transmits and also detect MR signals. Magnet assembly 12, gradient coil assembly 22, and body RF coil 24 are collectively referred to as a scanner assembly 50, because scanner assembly 50 forms into one unit and is in a scanner room. Scanner assembly 50 has a bore 46, where the subject is positioned during scanning. Scanner assembly 50 shown in FIG. 1 is a closed bore system, where the bore is cylindrical. Scanner assembly 50 may be magnet assemblies of other designs, such as an open-bore system, a dipolar electromagnet configuration, or a Hallbach configuration.

In the example embodiment, MR system 10 also includes a controller 30, a magnetic field control 32, a gradient field control 34, a memory 36, a display device 38, a transmit/receive (T/R) switch 40, an RF transmitter 42, and a receiver 44. In operation, a subject is placed in bore 46 on a suitable support, for example, a motorized table (not shown) or other patient table. Magnet 14 produces a uniform and static magnetic field B0 across bore 46. Strength and homogeneity of the magnet field B0 in bore 46 and correspondingly in patient is controlled by controller 30 via magnetic field control 32, which also controls a supply of energized current to magnet 14. Gradient coil assembly 22 is energized by gradient field control 34 and is also controlled by controller 30, so that one or more gradient magnetic fields are imposed on the magnetic field B0. RF coil 24 and a receive coil, if provided, are selectively interconnected to one of RF transmitter 42 or receiver 44, respectively, by T/R switch 40. RF transmitter 42 and T/R switch 40 are controlled by controller 30 such that RF field pulses or signals are generated by RF transmitter 42 and are selectively applied to the subject for excitation of magnetic resonance in the subject.

In the example embodiment, following application of the RF pulses, T/R switch 40 is again actuated to decouple RF transmit coil 24 from RF transmitter 42. The detected MR signals are in turn communicated to controller 30 which may organize the MR signals in a particular format for storage in memory 36. Controller 30 includes a processor 48 that controls the processing of the MR signals to produce signals representative of an image of the patient, which are transmitted to display device 38 to provide a visual display of the image.

Magnet 14 of magnet assembly 12 is used to generate a magnetic field in MR system 10 by electric current flowing along magnet windings of magnet 14. The current is in a range of hundreds of amperes. In some known systems, an electric current from a power source is constantly applied to the magnet to produce the magnetic field. A constant supply of the high electric current would significantly increase the running cost of an MR system. Magnet 14 is a superconducting magnet, where magnet 14 operates at a superconducting temperature, such as 4 K, of wire windings of magnet 14 such that winding wires do not have electrical resistance to the current and external power source is not needed. This mode of operation of magnet 14 is referred to as a persistent current mode.

A switch assembly is used to excite the magnet to operate in a persistent current mode. A switch assembly includes a switch that includes windings. The switch switches between a resistive mode and a superconducting mode. In the resistive mode, the switch operates at a temperature above the superconducting temperature of windings of the switch, such as 80 K. In the superconducting mode, switch assembly 200 operates at the superconducting temperature, such as 4 K, of the windings of the switch. The switch is electrically connected the power source in parallel with the magnet, during ramp-up of the magnet. To generate the magnetic field, the switch operates in the resistive mode such that electric current is injected to the switch due to the resistance in windings of the switch at the resistance mode. When the electric current flowing through the switch reaches a desired level for producing the field strength of the magnetic field, the external power source is disconnected and the switch is switched to operate at the superconducting mode. The switching is accomplished by changing the temperature of switch. A heater is used to heat the switch. The switch is typically cooled by cryogen such as liquid helium. As a result, heating of the switch boils off the cryogen.

During ramp-down or quench of the magnet, the magnetic field produced by the magnet is reduced by switching the switch to operate from the superconducting mode to the resistive mode. The flow of current through resistance generates heat, which also boils off the cryogen.

Consequently, the switching of the switch boils off liquid helium. Liquid helium is relatively costly to produce or to re-liquefy and is a finite resource.

On the other hand, it is desirable to have a fast switch to reduce the consumption of electric power and ramping time.

The speed of the switch partially depends how fast the temperature of the switch is changed. Faster the switching, without changing the system design, faster liquid helium will be boiled off, which may pose challenges to the system as to venting and pressure release. Therefore, there is a long-felt need to reduce the boiloff and increase the speed of switches.

Systems, assemblies, and methods described herein provide switch assemblies and switches that result in relatively less helium boiloff and faster switching, compared to known systems. Pressure valves of the switch assembly isolate the switch from the rest of the cryogen flow, reducing the helium boiloff and increasing the speed of switching. Further, a cryogen gas loop is thermally coupled with the switch and the cold head and transfers heat away from the switch, further increasing the speed of switching and reducing boiloff.

Figure 2:
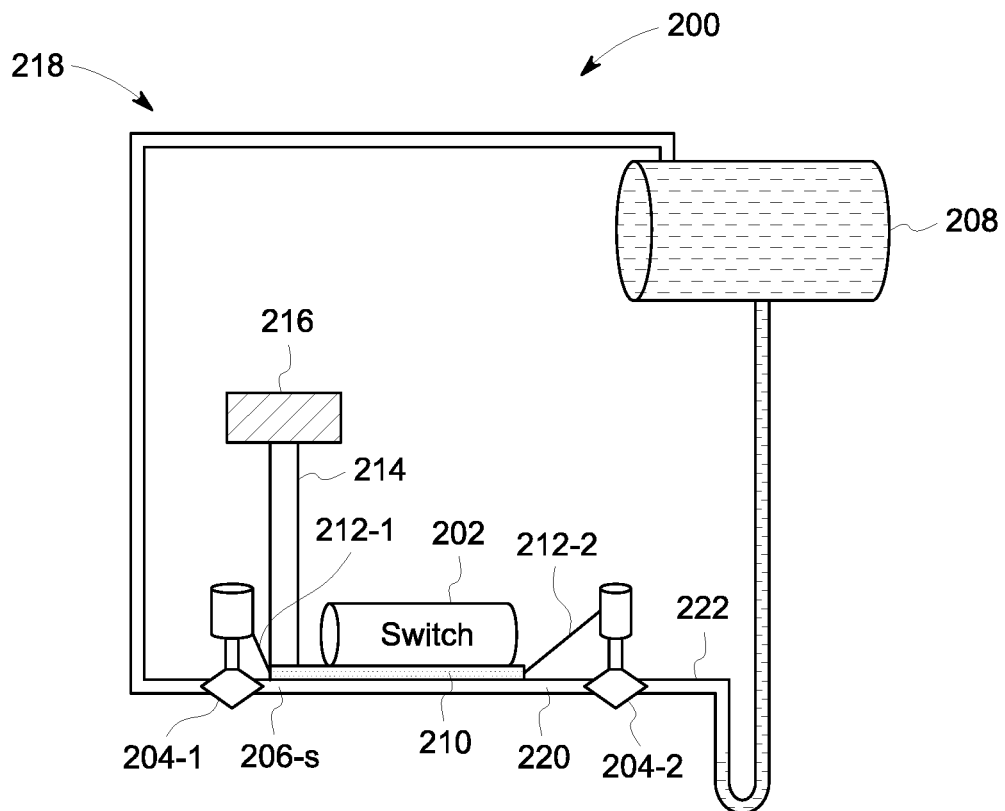
FIG. 2 is a schematic diagram of an example switch assembly of a magnet assembly of the system shown in FIG. 1.

FIG. 2 is a schematic diagram of an example switch assembly used in magnet assembly 12. In the example embodiment, switch assembly 200 is positioned at the lower section of magnet assembly 12 to ensure cryogen in contact with switch assembly 200 such that switch assembly 200 remains in the superconducting mode during operation. Switch assembly 200 includes switch 202 configured to switch between a resistive mode and a superconducting mode. Switch 202 is configured to operate in a cryogenic environment, such as having a temperature of 80 Kelvin (K) or lower. Switch assembly 200 further includes pressure valves 204-1, 204-2. Pressure valves described herein is configured to operate in a cryogenic environment and in presence of magnetic field. Pressure valve 204 is controlled by a pressure change, where the open and close of pressure valve 204 is caused by the pressure change in pressure valve 204. With the presence of magnetic field, valves operating with electric current such as solenoid valves tend to fail or malfunction due to the interference from the magnetic field with the electric current and/or operating magnetic field of the valves. A shield may be used, which increases costs in design and manufacturing. Further, at the low temperature of the superconducting magnet assembly 12, materials tend to brittle. In contrast, pressure valves 204 described herein are configured to operate in superconducting magnet assembly 12.

In the example embodiment, switch 202 is in thermal contact with a thermosyphon tube 206. As used herein, object A being in thermal contact or being thermally coupled or connected with object B is that heat is transferred between objects A and B via heat conduction, where objects A and B are in direct contact with one another or connected via material that has a relatively high thermal conductivity and is efficient at conducting heat. Example material is copper or aluminum. In contrast, an object fabricated with a relatively low thermal conductivity is used to block or limit heat transfer. Thermosyphon tube 206 may be part of cryogen network 218, where cryogen of magnet assembly 12 is circulated, and may be connected to a cryogen tank 208.

In the example embodiment, switch assembly 200 further includes a thermal interface 210 between switch 202 and thermosyphon tube 206. Thermal interface 210 is in thermal contact with switch 202 and thermosyphon tube 206, facilitating thermal conduction between switch 202 and thermosyphon tube 206. The material of thermal interface 210 may be chosen to have a thermal conductivity as high as available. Thermal interface 210 may be a layer of cryogenic rated epoxy such as Stycast® 2850 between switch 202 and thermosyphon tube 206. In some embodiments, thermal interface 210 includes a layer of a copper sheet. The copper sheet is wrapped around switch 202 using a cryogenic rated epoxy and the copper sheet is soldered to thermosyphon tube 206.

In some embodiments, switch assembly 200 further includes thermal links 212-1, 212-2 in thermal contact with thermal interface 210 and pressure valve 204-1, 204-2, respectively. Thermal links 212 may be fabricated with copper, aluminum, copper alloy, aluminum alloy, or any combination thereof. The grade of material of thermal link 212 and/or configuration of thermal link 212 such as a cross-sectional area and length of thermal link 212, may be chosen based on design specifications, such as cooldown time and allowable heat transfer.

In the example embodiment, switch assembly further includes a cryogen gas loop 214, which is in thermal contact with thermal interface 210 at one end and heat sink 216 of magnet assembly 12 at the other end. Heat sink 216 may be thermal shield assembly 16 of magnet assembly 12. In some embodiment, heat sink 216 is cold head 602 (see FIGS. 6-8 described later) of magnet assembly 12. Cold head 602 may be a two-stage refrigerator. A first cooling stage is thermally linked to thermal shield assembly 16, and provides cooling to a first temperature, typically in the range of 40 K-100 K. A second cooling stage provides colling of the cryogen to a much lower temperature, typically in the region of 4 K-10 K. Cryogen gas loop 214 may be circulated with gaseous cryogen and in thermal contact with a first stage of cold head 602.

In operation, heat from switch 202 is transferred away from switch 202 via thermal interface 210. Thermal interface 210 further transfers the heat to cryogen carried inside thermosyphon tube 206 and to cryogen gas loop. Switch 202 is also thermally in contact with pressure valves 204-1, 204-2 via thermal links 212, triggering the open and close of pressure valves 204 because pressure valves 204 are pressure actuated and heat changes the pressure in pressure valves 204.

When a ramping process of ramping up or ramping down is not carried out, pressure valves 204 are open and cryogen flows through cryogen network 218 and keeps switch 202 in the persistence mode at the temperature of around 4 K. For a superconducting magnet, a ramping process is a process to ramp up the magnetic field of the magnet from zero to a desired field strength, such as 1.5 Tesla (T), 3 T, or higher, or ramp down the magnetic field, In a ramping process, before turning a switch heater on to heat up switch 202 and place switch 202 in the resistive mode, the pressure in pressure valve 204-1 is increased and pressure valve 204-1 is actuated and blocking thermosyphon tube 206. The switch heater of switch 202 is then turned on to increase temperature of switch 202. During this process, the liquid in thermosyphon tube 206 is pushed away from switch 202 by the heat from switch 202. When switch 202 has reached a preset temperature range, pressure valve 204-2 is actuated and closed to block off switch 202, isolating the span 220 of thermosyphon tube 206 between pressure valves 204-1, 204-2. Pressure valve 204-2 may be actuated by the heat from switch 202 transferred through thermal link 212-2. Pressure valve 204-2 may be configured as such that when the end of the preset temperature range is reached, pressure valve 204-2 is fully actuated, where pressure valve 204-2 extends into thermosyphon tube 206 to the maximum extent of pressure valve 204-2. In some embodiments, an external heater is attached to pressure valve 204-2, assisting the actuation or completely replacing thermal link 212-2.

With pressure valves 204-1, 204-2 closed, switch 202 is isolated from the rest of cryogen network 218, limiting heat transferred to the remaining cryogen network 218. A limited amount of heat may be transferred via tube wall 222 of thermosyphon tube 206.

Continuing with the ramping process, the temperature of switch 202 keeps rising towards the operating point such as 50 K. As switch 202 is warming up, when the temperature of switch 202 rises above the temperature range of heat sink 216, gas in cryogen gas loop 214 starts to carry heat away from thermal interface 210 to heat sink 216. The geometry, such as diameters, of cryogen gas loop 214 and gas pressures in cryogen gas loop 214 are designed such that the heat generated by switch 202 is carried to heat sink 216 to maintain the switch temperature in a preset operating range.

At the end of ramping process, heat generated by switch 202 is gradually reduced. In conjunction with cryogen gas loop 214 cooling thermal interface 210, temperatures of pressure valves 204 are reduced. The temperatures of pressure valves 204 reduce to the actuating range of pressure valves 204 such that the pressure in pressure valves 204 is reduced to a level for pressure valves 204 to pull back. At that point, pressure valves 204-1, 204-2 open to let cryogen flow through thermosyphon tube 206, cooling switch 202 down to place switch 202 in the persistent mode.

Switch assembly 200 is advantageous in reducing boiloff of cryogen during the switching. Pressure valves 204 block off the section of thermosyphon tube 206 from the rest of circulation of cryogen, thereby limiting the boiloff to cryogen in the section of thermosyphon tube 206 between pressure valves 204. Further, in a known assembly, the cooling of switch is only through being in contact with a thermosyphon tube. As a result, the entire heat load goes towards the cryogen, and cryogen continues to boil off during the switching. In contrast, cryogen gas loop 214 is in thermal contact with heat sink 216 such as a cold head 602. The heat load from switch 202 is split into two parts, where a small part goes to thermosyphon tube 206 and cryogen inside thermosyphon tube 206, but the majority part goes to heat sink 216. Cold head 602 is an efficient cooling device, reducing the time needed to cool switch 202 without boiloff of cryogen.

Switch assembly 200 is also advantageous in reducing the switching time of switch 202. The switching time depends on how fast the temperature of switch 202 is changed. Pressure valves 204 are configured to open and close quickly and effectively in a cryogenic environment and in presence of magnetic field, As a result, cryogen is circulated to switch 202 quickly to cool switch 202 down to switch from the resistive mode to the superconducting mode once the desired current is reached. Further, cryogen gas loop 214 and heat sink 216 further cools switch 202.

Figure 3:
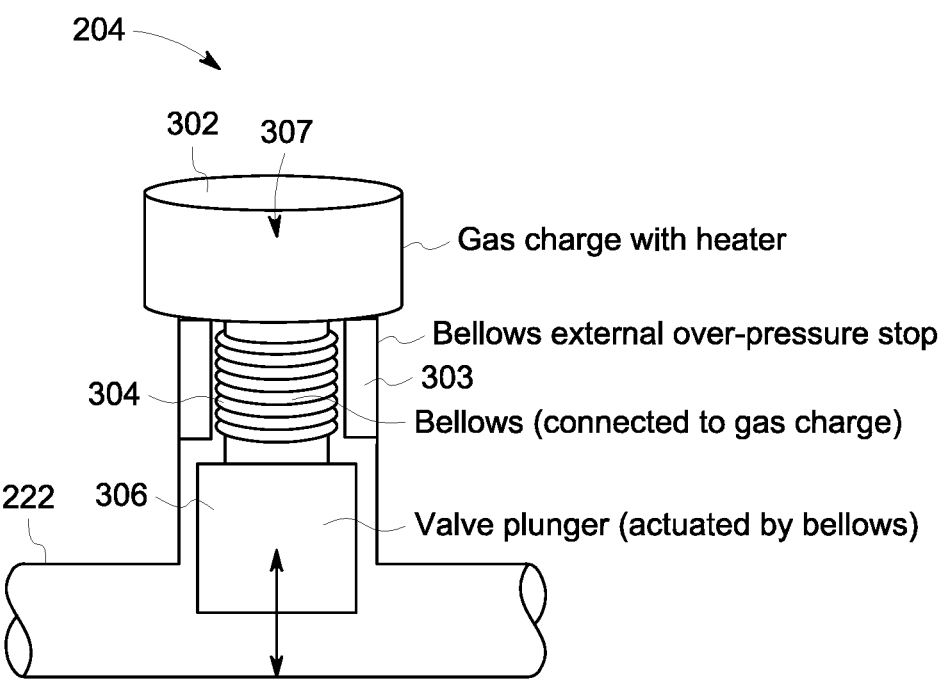
FIG. 3 is an example pressure valve of the switch assembly shown in FIG. 2.

FIG. 3 is a cross-sectional view of an example pressure valve 204. In the example embodiment, pressure valve 204 includes a valve head 302, a bellows assembly 304, and a plunger 306. Valve head 302 is filled with cryogen, which may be liquid or gaseous, or change between liquid and gas depending on the temperature. The cryogen filled in valve head 302 may be helium. Valve head 302 defines a gas chamber. Bellows assembly 304 is in communication with gas chamber 307. Plunger 306 is connected with bellows assembly 304. Bellows assembly 304 may include one chamber or more than one chamber (see FIGS. 4A-5B described later). In some embodiments, pressure valve 204 includes an over-pressure stop 303. Over-pressure stop 303 is positioned exterior to bellows assembly 304 and configured to prevent over pressure from causing bellows assembly 304 expanding too far away from valve head 302 and damaging tube wall 222, In the example embodiment, pressure valve 204 is fabricated with non-magnetic material. Example materials may be copper, brass, stainless steel, or a combination thereof. Components of pressure valve 204 may be fabricated with the same material or different materials. Valve head 302 and bellows assembly 304 are fabricated with non-magnetic metal. Bellows assembly 304 may be fabricated with materials such as brass, stainless steel, or a combination thereof. In some embodiments, plunger 306 is fabricated with material having a relatively low thermal conductivity, reducing heat transferred through plunger to cryogen in the remaining cryogen network 218 (see FIG. 2). Example material for plunger 306 is brass, stainless steel, polytetrafluoroethylene (PTFE), G-10, or any combination thereof. Plunger 306 may be fabricated with brass and/or stainless steel coated or laminated with PTFE or G-10. Plunger 306 fabricated with metallic material facilitates manufacturing of pressure valve 204 when assembling plunger 306 with other metallic components of pressure valve 204.

In operation, pressure in gas chamber 307 is increased by heating the cryogen in gas chamber 307. The pressure increase pushes bellows assembly 304 and in turn plunger 306 away from valve head 302, closing pressure valve 204. When pressure in gas chamber 307 decreases by reducing the temperature of the cryogen, the pressure decrease pulls bellows assembly 304 and plunger 306 toward valve head 302, opening pressure valve 204. In some embodiments, pressure changes of cryogen in gas chamber 307 is caused by filling more cryogen or evacuating cryogen out of gas chamber 307.

Figure 4A:
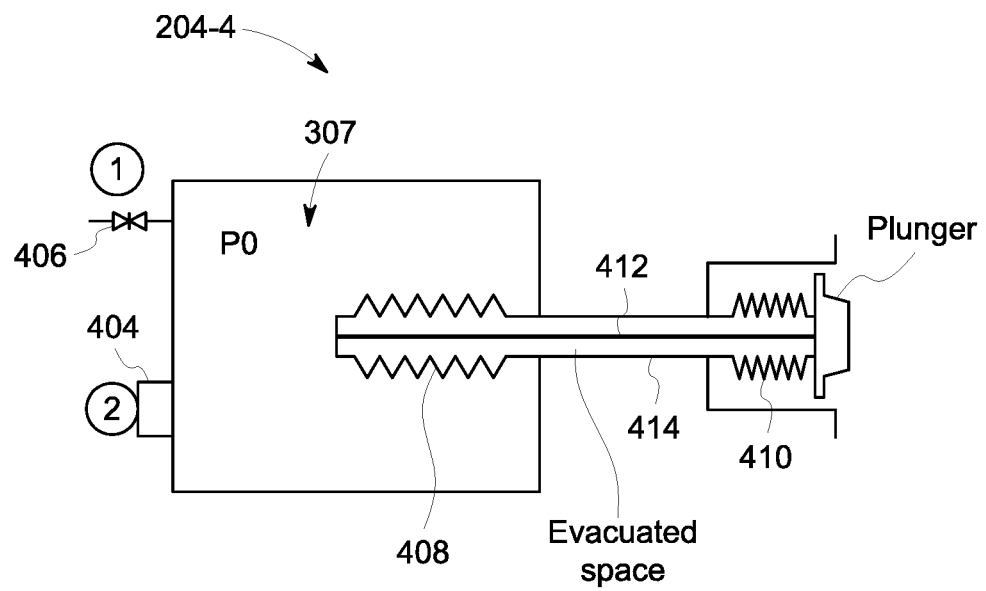
FIG. 4A is a schematic diagram of another example pressure valve of the switch assembly shown in FIG. 2.
Figure 4B:
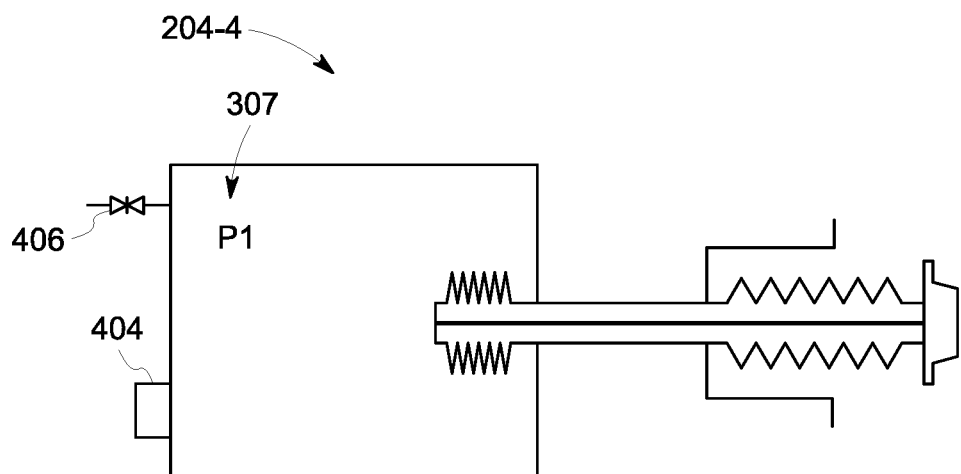
FIG. 4B is a schematic diagram of the pressure valve shown in FIG. 4A when the pressure valve is actuated.
Figure 4C:
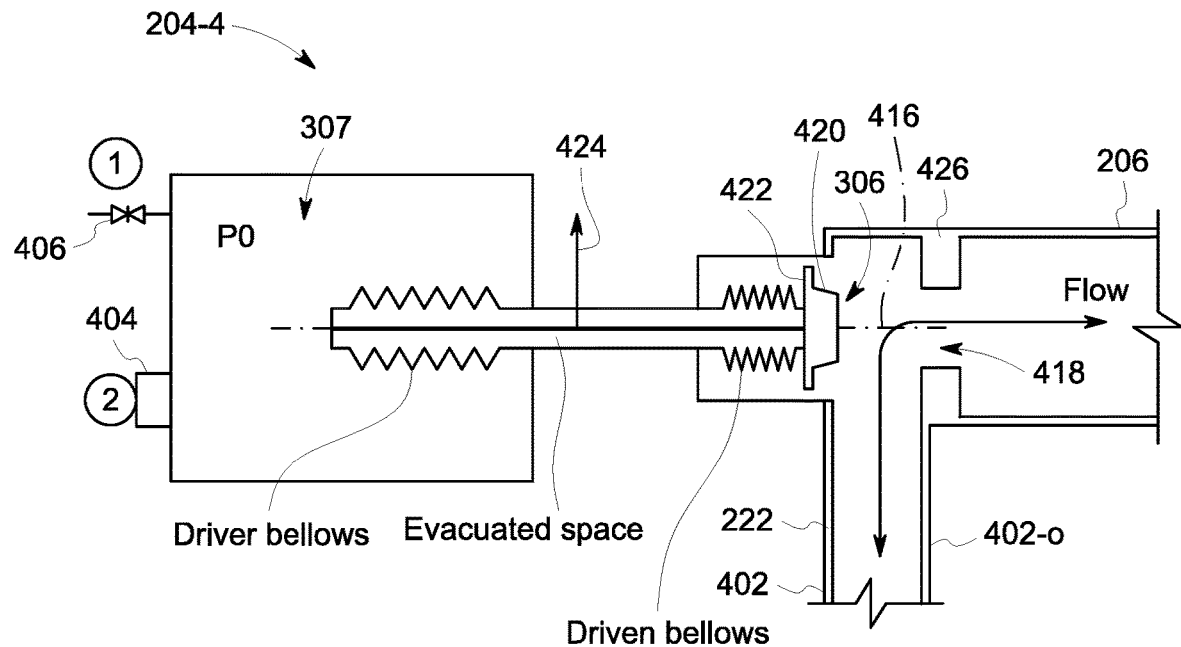
FIG. 4C is a schematic diagram illustrating that the pressure valve shown in FIG. 4A is coupled with a thermosyphon tube.
Figure 4D:
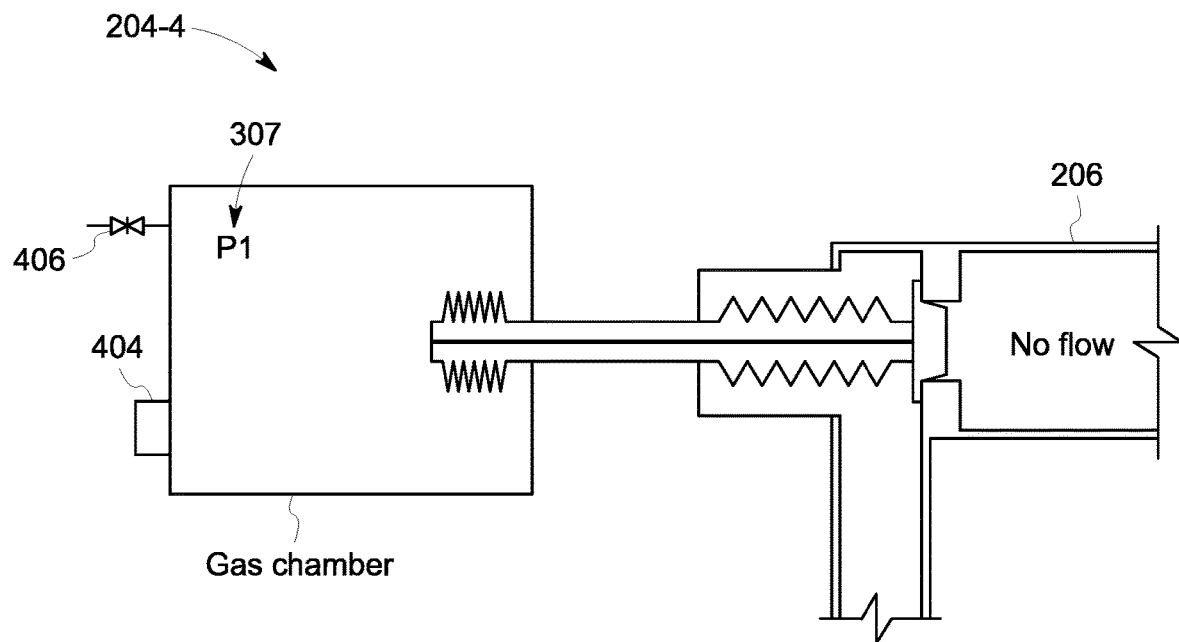
FIG. 4D is a schematic diagram illustrating the pressure valve shown in FIG. 4C when the pressure valve is actuated.

FIGS. 4A-4D show another example pressure valve 204-4. FIGS. 4A and 4B show pressure valve 204-4 by itself at an open state (FIG. 4A) and a closed state (FIG. 4B). FIGS. 4C and 4D show pressure valve 204-4 installed on a side 402 of thermosyphon tube 206 and being used to allow (FIG. 4C) or block (FIG. 4D) flow in cryogen network 218 (see FIG. 2). In the example embodiment, Pressure valve 204-4 includes a heater 404 coupled to valve head 302 and configured to heat the cryogen in gas chamber 307. In some embodiments, heater 404 may be turned on or off via a timer. Pressure valve 204 further includes a charge valve 406, which opens to charge cryogen into gas chamber 307 and closes to seal off gas chamber 307. Charge valve 406 is positioned adjacent the valve head 302. Bellows assembly 304 may include driver bellows 408 and driven bellows 410. A plunger shaft 412 connects driver bellows 408 with driven bellows 410. Bellows assembly 304 may further include a sleeve tube 414 surrounding plunger shaft 412. Plunger shaft 412 moves back and forth in sleeve tube 414 along a longitudinal axis 416 of sleeve tube 414. To reduce head transfer, plunger shaft 412 and/or sleeve tube 414 may be fabricated with stainless steel, instead of brass or copper. Stainless steel has a lower thermal conductivity than brass or copper. A contact between plunger 306 and thermosyphon tube 206 when pressure valve 204 is closed may be enhanced to reduce boiloff and thermal transfer. For example, plunger 306 may have an exterior shape of a conical frustum or a cone. Thermosyphon tube 206 may define an opening 418 on a side 402-o of tube wall 222 opposite side 402 where pressure valve 204 couples with thermosyphon tube 206. Opening 418 is sized to receive at least a portion of plunger 306 therein (FIG. 4D). Plunger 306 may include a plunger head 420 and a flange 422 extending from plunger head 420 along a radial direction 424 of plunger shaft 412. As a result, when plunger head 420 is received in opening 418, flange 422 is placed along a rim 426 of opening 418, assisting in blocking flow.

In operation, the cross section and wall thickness of bellows assembly 304 are chosen such that bellows spring constant and operating pressure are optimized for cryogenic operation and for ensuring that plunger 306 is pulled fully to open the flow. Plunger shaft 412 is selected such that plunger shaft 412 limits heat transfer and has the stiffness to hold plunger head 420 in place during operation. Pressure valve 204 may be welded on or bolted on thermosyphon tube 206 with a gasket such as a metallic or PTFE gasket to ensure a no-leak joint between pressure valve 204 and thermosyphon tube 206.

Figure 5A:
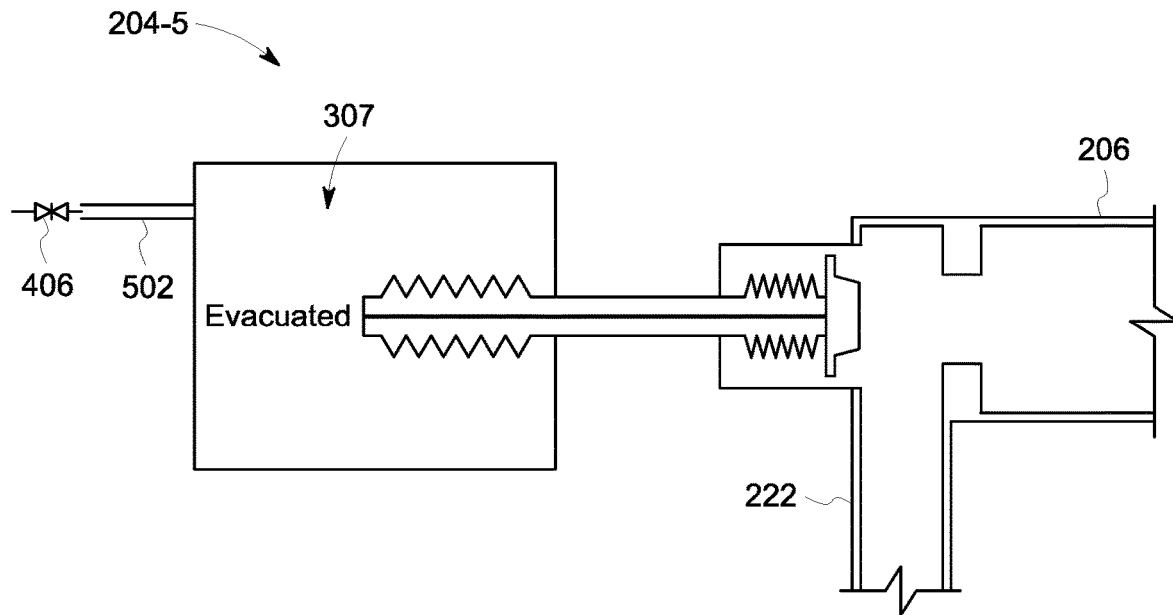
FIG. 5A is a schematic diagram of one more example pressure valve of the switch assembly shown in FIG. 2, where the pressure valve is coupled with a thermosyphon tube.
Figure 5B:
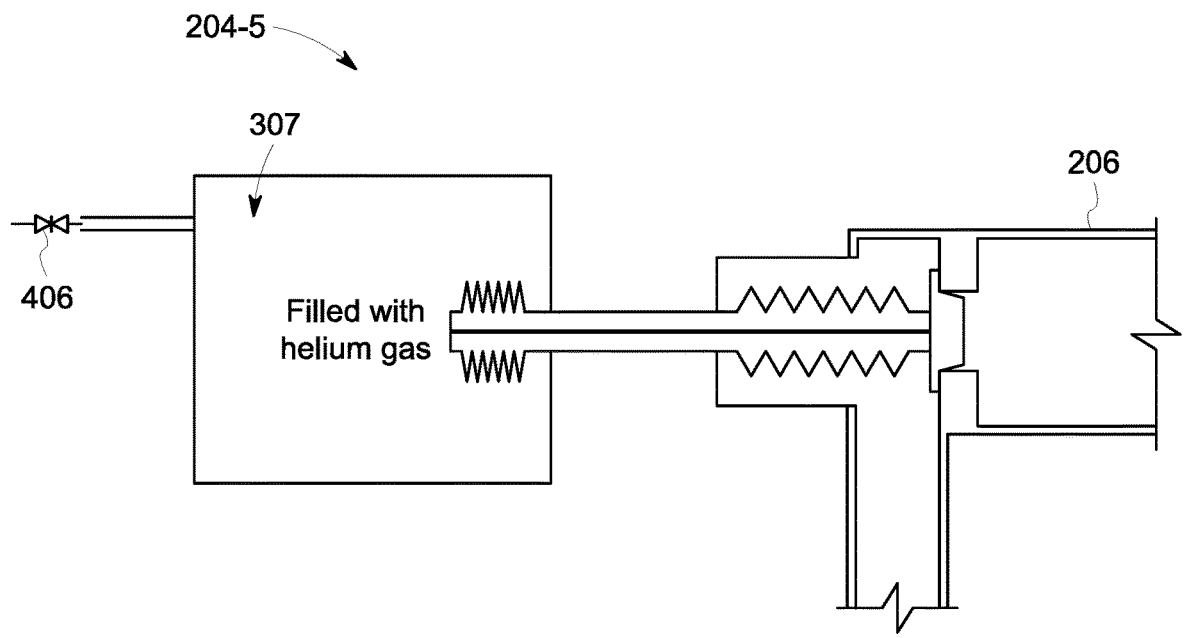
FIG. 5B is a schematic diagram of the pressure valve shown in FIG. 5A when the pressure valve is actuated.

FIGS. 5A and 5B show one more example pressure valve 204-5. Compared to pressure valve 204-4 shown in FIGS. 4A-4D, pressure valve 204-5 does not include a heater 404 and charge valve 406 is moved further away from valve head 302. In the example embodiment, charge valve 406 is positioned in the space having an ambient temperature or a space external to magnet 14 such as outside magnet vacuum vessel 19 (collectively referred to as a magnet external space). At the magnet external space, the temperature is higher than the temperature of magnet 14, which is in a space internal to magnet vacuum vessel 19, and is typically above 50 K. The higher temperature in the magnet external space is not as demanding on a valve as the temperature internal to magnet vacuum vessel 19. Removal of heater 404 is also advantageous in reducing heat transfer to cryogen in cryogen network 218, further reducing cryogen boiloff. Charge valve 406 is installed on an evacuation and filling tube 502 leading to gas chamber 307. Gas chamber 307 is evacuated to pull plunger 306 back to open pressure valve 204. Cryogen may be charged into gas chamber 307 to push plunger 306 forward to close pressure valve 204. The operation via filling and evacuation of pressure valve 204-5 is faster than operation via heater 404 of pressure valve 204-4 and eliminates the need of heater 404 and the process of cooling in opening pressure valve 204.

Figure 6:
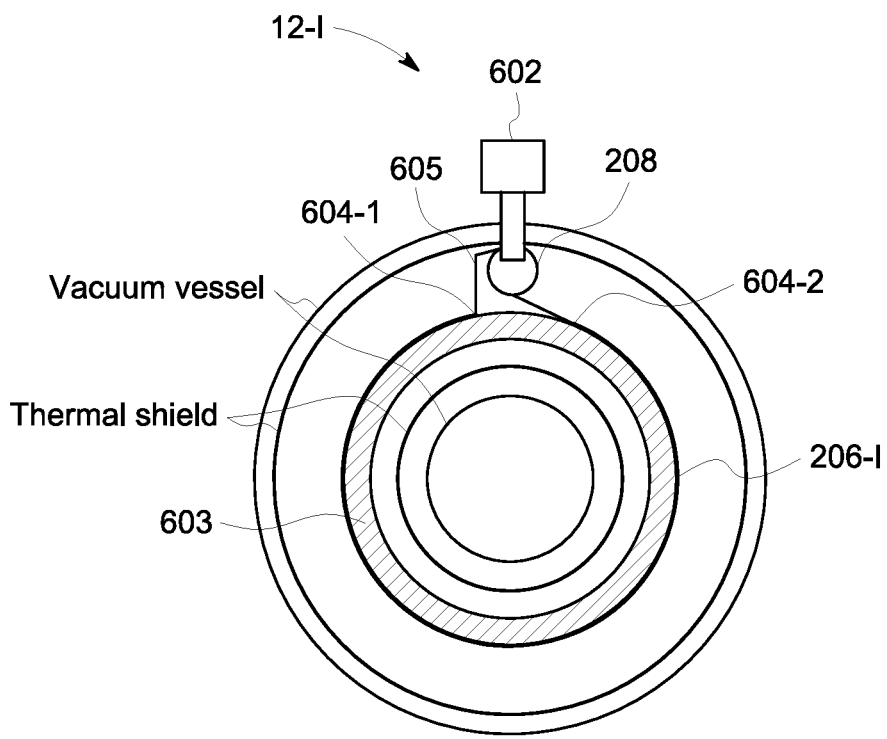
FIG. 6 is a schematic diagram of an example magnet assembly of the system shown in FIG. 1.

Switch assembly 200 may be used in a low-cryogen magnet assembly 12-1. A low-cryogen magnet assembly may be a cryogen-free magnet assembly, where pressurized gaseous cryogen is filled into thermosyphon tubes and cooled to liquid cryogen using a cooler. FIG. 6 is a schematic diagram of an example low-cryogen magnet assembly 12-1. In low-cryogen magnet assembly 12-1, magnet assembly 12-1 uses conduction cooling, where magnet windings 603 are cooled and maintained at superconducting temperature via liquid helium being circulated in thermosyphon tubes 206. Thermosyphon tubes 206 are thermally connected or in thermal contact with magnet windings 603. Switch assembly 200 may be installed in magnet assembly 12 inside vacuum vessel 19, or inside thermal shield assembly 16. Referring back to FIG. 2, thermosyphon tube 206 is connected to cryogen tank 208 at two ends of thermosyphon tube 206 and forms a flow loop. Thermosyphon tube 206 may be a separate tube from thermosyphon tube 206-1 shown in FIG. 6 and both tubes are directly connected to cryogen tank 208. Alternatively, thermosyphon tube 206 branches off from thermosyphon tube 206-1. The branching point may be on thermosyphon tube 206-1 outside the span of thermosyphon tube 206-1 that is in thermal contact with magnet windings 603. For example, in magnet assembly 12-1, thermosyphon tube 206-1 connects with cryogen tank 208 and is in thermal contact with magnet windings 603 between point 604-1 and point 604-2. Branching points may be in a span 605 of thermosyphon tube 206-1 that is between cryogen tank 208 and either point 604-1, 604-2.

Figure 7A:
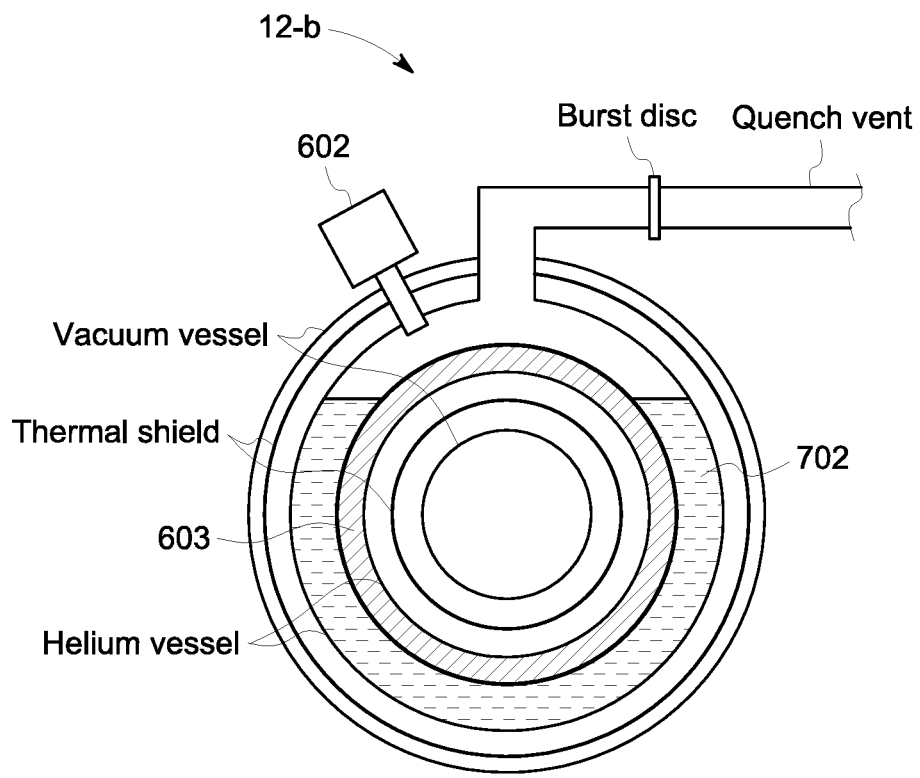
FIG. 7A is a schematic diagram of another example magnet assembly of the system shown in FIG. 1.
Figure 7B:
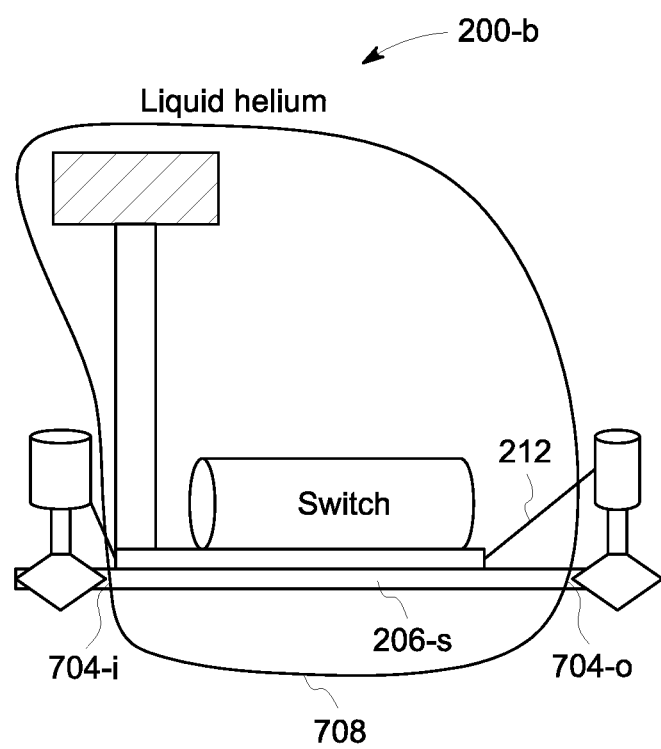
FIG. 7B is a schematic diagram of an example switch assembly of the magnet assembly shown in FIG. 7A.

Switch assembly 200 may also be included in a helium-bath magnet assembly 12-b. FIG. 7A is a schematic diagram of an example helium-bath magnet assembly 12-b. FIG. 7B is a schematic diagram of an example switch assembly 200-b for helium-bath magnet assembly 12-b. In the example embodiment, A helium bath mechanism is used to cool magnet windings 603. Cryostat vessel, cryogen vessel, or helium vessel 18 includes liquid helium 702. Magnet windings 603 are positioned inside cryogen vessel 18 and are bathed in liquid helium 702. Switch assembly 200-b may be installed in magnet assembly 12-b by enclosing switch 202 inside a switch vacuum enclosure 708. Cryogen gas loop 214 and/or heat sink 216 may also be enclosed inside switch vacuum enclosure 708. Alternatively, heat sink 216 may be cold head 602 of magnet assembly and cryogen gas loop 214 is connected to cold head 602. Pressure valves 204-1, 204-2 are positioned in liquid helium. To limit cryogen boiloff, pressure valves 204-1, 204-2 may be placed on an inlet 704-i or an outlet 704-o of switch vacuum enclosure 708. Thermal links 212 between thermal interface 210 and pressure valves 204 may be eliminated, to reduce cryogen boiloff and simplifying the design and assembling.

In a helium-bath magnet assembly, magnet windings are completely or partially immersed or bathed in liquid helium. A helium-bath magnet assembly may be referred to as an open system, where cryogen is free to vent during a quench or a partial quench. As a result, a large quantity of liquid helium is needed, which is at the level of one or two thousand liters. A quench vent pipe is needed to safely release the large amount of helium into atmosphere during a quench or a partial quench. A magnet assembly is often installed in an interior room of a large building, like a hospital. Installing a quench vent pipe is logistically difficult and costly in terms of labor and materials. Further, after a magnet assembly quenches, a large quantity of liquid helium needs to be refilled for ramping the magnet assembly back in operation. The refill of liquid helium increases operation costs of the magnet assembly.

In a low-cryogen magnet assembly, the conduction cooling of the magnet assembly needs only a few liters, e.g. 5 liters, for cooling magnet assembly. A low-cryogen magnet assembly may be referred to as a sealed system, where cryogen is sealed within the magnet assembly and is not vented during a quench or a partial quench. A low-cryogen magnet assembly does not vent after a quench or a partial quench. Therefore, a quench vent pipe or helium refill is not needed. However, a low-cryogen magnet assembly needs to cool down at site after transportation. For a helium-bath magnet assembly, during transportation of the magnet assembly, some helium, e.g., approximately 200 liters of helium, is boiled off. At the site, liquid helium is added to the system and the magnet assembly is in operation. In a low-cryogen magnet assembly, helium is typically sealed inside the thermosyphon tube to prevent leaking in order to keep sufficient amount of liquid helium for cooling the magnet assembly. The relatively small amount of liquid helium does not last through transportation. A long period of time, e.g., several days, is needed to cool the helium down to liquid helium. Additional equipment is needed for the cooldown. Alternatively, special logistics arrangements are needed to keep the magnet assembly cold during transportation. Further, recovery from a quench or a partial quench takes longer than a helium-bath magnet assembly because of the relatively long cooldown time to liquefy the helium. In addition, redundant components such as an air cooled cold head compressor and/or external power generators are needed to keep the operation of a low-cryogen magnet assembly in situations of power outage or unreliable power supply. Automated ramp down or up also needs to be included to avoid a full field quench, where the magnetic field is reduced to zero. These external and backup equipment adds to the costs of low-cryogen magnet assemblies. One more disadvantage of a low-cryogen magnet assembly is that a low-cryogen magnet assembly faces difficulties in handling the heat generated by the magnet-gradient interaction in MR systems during certain scans, especially at high field strength and busy sites, due to the limited cooling capability of the relatively small amount of liquid helium in the system.

Hybrid magnet assemblies described herein overcome the disadvantages of a helium-bath magnet assembly and a low-cryogen magnet assembly, and in meantime, have the advantages of both assemblies. A hybrid magnet assembly may be in operation at site immediately after transportation. A vent line is not required in a hybrid magnet assembly. The additional equipment needed in a low-cryogen magnet assembly is not needed in a hybrid magnet assembly.

Figure 8:
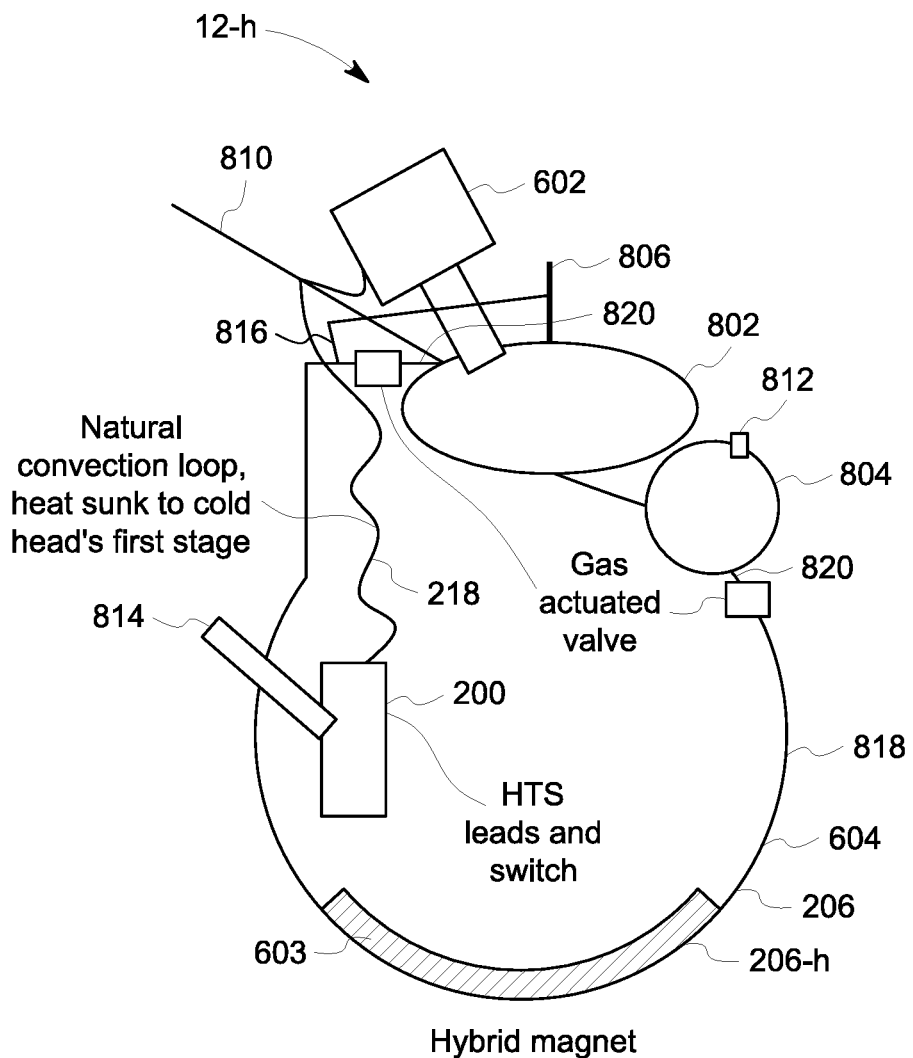
FIG. 8 is a schematic diagram of one more example magnet assembly of the system shown in FIG. 1.

FIG. 8 is a schematic diagram of an example hybrid magnet assembly 12-h. In the example embodiment, magnet assembly 12-h includes a main tank 802 and a metering tank 804. Metering tank 804 is in communication with main tank 802 such that liquid cryogen in main tank 802 may flow down to metering tank 804. Main tank 802 and metering tank 804 are positioned at the top of magnet assembly 12-h such that cryogen flows down to and cools magnet windings 603.

In the example embodiment, main tank 802 has a volume of approximately 200 liters, which keeps magnet windings 603 at superconducting temperature, e.g., less than 5 K, for up to five days in transportation with a potentially enough volume for operation of magnet assembly 12 for majority of operations. As a result, cooldown is not needed at site after transportation. Magnet assembly 12-h has a ride through time of approximately five days. A ride through time is the amount of time it takes to exhaust the cryogen in the magnet assembly, either from being evaporated or into a gaseous state. A meter (not shown) may be installed with main tank 802 to gauge the level of liquid helium. In some embodiments, a tank vent line 806 may be installed with main tank 802. Tank vent line 806 is used to vent vaporized cryogen. Tank vent line 806 also provides an access to refill cryogen into main tank 802. A pressure relief valve (not shown) may be included in tank vent line 806 to alleviate pressure build up in main tank 802. In some embodiments, magnet assembly 12-h does not include a vent line. Metering tank 804, the design of a cryogenic circuit and control of cryogen pressure described herein enables the configuration of a magnet assembly 12 without a vent line.

In the example embodiment, magnet assembly 12 includes a cold head 602 coupled with main tank 802. Magnet assembly 12 further includes a gas charge line 810 in communication with main tank 802. Gas charge line is in thermal contact with cold head 602 via a thermal link 212. Thermal link 212 facilitates heat transfer from gas charge line 810 to cold head 602. Thermal link 212 may be coupled to a first stage of cold head 602. In operation, gaseous helium is charged into magnet assembly 12 through gas charge line 810. As gaseous helium being charged into main tank 802, gaseous helium is cooled by cold head 602 to a first stage temperature, such as 50 K, through thermal link 212, The low temperature gaseous helium is further cooled down by the second stage of cold head 602 into liquid helium. The liquefied helium is stored in main tank 802. Magnet assembly 12 having a gas charge line 810 is advantageous in remote areas that have limited access to liquid helium. Having a gas charge line 810 also saves costs associated with liquid helium.

In the example embodiment, metering tank 804 has a volume of a few liters, such as 5 liters. The amount of helium lasts approximately 6 hours. If magnet assembly 12-h is configured as a sealed system, the ride through time is approximately 6 hours. Metering tank 804 includes a level gauge or meter 812 configure to measure the amount of liquid helium inside metering tank 804. When the liquid helium is below a preset threshold, additional liquid helium is filled into metering tank, or alternatively liquid helium stored in main tank 802 is flowed into metering tank 804, to the preset threshold level. Metering tank 804 also provides the function of monitoring the level of liquid helium inside metering tank 804. At some sites, no venting of gaseous helium into the scanner room is desired. Magnet assembly 12 will be operated as a sealed system. To ensure pressure inside thermosyphon tube 206, main tank 802, and metering tank 804 is within the pressure level allowed by magnet assembly 12, metering tank 804 monitors the liquid helium level to not go above a predetermine level.

In the example embodiment, magnet assembly 12 further includes thermosyphon tube 206. Metering tank 804 and thermosyphon tube 206 define a path 818 along which cryogen flows. Magnet assembly 12 further includes a lead assembly 814 and switch assembly 200. Lead assembly 814 may be a high temperature superconducting lead assembly 814. Lead assembly 814 is used to inject electric power to magnet assembly 12-h during the ramping of magnet assembly. A cryogen gas loop 214 of switch assembly 200 may be in thermal contact with cold head 602 of magnet assembly 12-h. In some embodiments, magnet assembly 12-h may further include a tube vent line 816 for releasing pressure built up in thermosyphon tube 206.

In the example embodiments, magnet assembly 12 further includes pressure valves 204 installed adjacent to ends 820 of thermosyphon tube 206. Pressure valves 204 are configured to operate in a cryogenic environment and in the presence of magnetic field generated by magnet windings 603. Pressure valves 204 may be thermally connected or in thermal contact with thermosyphon tube 206 such that pressure valves 204 are actuated when the temperature of thermosyphon tube 206 is above a preset temperature. Alternatively, heater 404 of pressure valves 204 may be turned on or off by a timer. Pressure valves 204 may be turned on to allow flow of cryogen to cool magnet windings 603 during operation of magnet assembly 12-h. Pressure valves 204 may be turned off to isolate main tank 802 and metering tank 804 from the rest of magnet assembly 12 thermally. For example, during a quench or a partial quench, pressure valves 204 are turned off to block/significantly reduce flow of cryogen between thermosyphon tube 206 and tanks 802 and 804. The heat transfer from thermosyphon tube 206 to tanks 802, 804 is limited, thereby reducing the speed of helium boiloff and eliminating the need of a quench vent pipe. As a result, even when magnet assembly 12-h is configured as an open system, where cryogen is free to vent during a quench or a partial quench, the amount and speed of boiloff is limited to a level that a quench pipe is not needed. Further, turning-off pressure valves 204 also blocks off thermosyphon tube 206 from helium inside thermosyphon tube 206 being purged out of magnet assembly 12, thereby further reducing the amount of boiloff. In addition, magnet assembly 12-h is advantageous when power outage or unreliable power supply is experienced, where cold head 602 is not operating or does not meet the cooling need of magnet assembly 12. Liquid helium may be filled into main tank 802 to cool magnet assembly 12. During the refill, pressure valves 204 are turned off to limit the heat transfer and boiloff. After the refill, pressure valves 204 are turned back on such that magnet assembly 12 returns back to operation, without a quench or ramp down.

Magnet assembly 12-h is configurable and reconfigurable between an open system and a sealed system. A user may choose to configure magnet assembly 12-h as a sealed system by not including or filling any liquid helium in main tank 802. A user may choose to configure magnet assembly 12-h as an open system by filling liquid helium into main tank 802 before transportation. The amount of liquid helium in main tank 802 is enough to last through transportation. At site, unlike a low-cryogen magnet assembly, where cooldown is needed before operation of the magnet assembly, cooldown is not needed for magnet assembly 12-h to be in operation by using liquid helium inside metering tank 804 to cool magnet windings. A user may opt to vent out liquid helium remained in main tank 802 after transportation or keep the liquid helium in main tank 802 as backup. Magnet assembly 12-h may be reconfigured from an open system to a sealed system or vice versa. To reconfigure magnet assembly 12-h from an open system to a sealed system, cryogen in main tank 802 may be boiled off and magnet assembly 12-h is operated only with cryogen in metering tank 804. To reconfigure magnet assembly 12-h from a sealed system to an open system, cryogen may be filled into main tank 802, either from external cryogen container or from gas charge line 810.

Magnet assembly 12-h is also advantageous in handling heat generated by magnet-gradient interaction during certain scans, especially at MR system 10 of high field strength or busy sites, by using the added cooling capability of main tank 802. Further, magnet assembly 12-h provides flexibility in operating the magnet assembly, and in the meantime, reduces boiloff of liquid helium and the need for liquid helium and vent pipe.

In some embodiments, switch assembly 200 is used in a hybrid magnet assembly 12. Switch assembly 200 may be installed in magnet assembly 12 as shown in FIGS. 2 and 8. In the example embodiment, cryogen gas loop 214 is coupled to a first stage of cold head 602 (FIG. 8). Switch thermosyphon tube 206 may be branched off from thermosyphon tube 206-h in thermal contact with magnet windings 603. Branching point 604 is at the portion of thermosyphon tube 206-h that is not in thermal contact with magnet windings 603. Alternatively, switch thermosyphon tube 206-s (see FIG. 2) may be connected directly to main tank 802 and/or metering tank 804.

Figure 9:
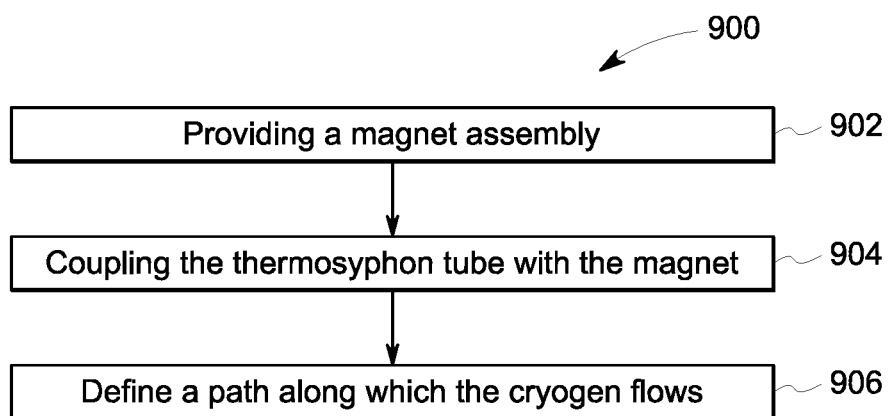
FIG. 9 is a flow chart of an example method of assembling the magnet assembly shown in FIGS. 1-5B and 8.

FIG. 9 is a flow chart of an example method 900 of assembling a magnet assembly. The magnet assembly may be magnet assemblies 12 described above. In the example embodiment, method 900 includes providing 902 a magnet assembly that includes a magnet, a thermosyphon tube configured to carry cryogen, a main tank, and a metering tank. The magnet is configured to generate a polarizing magnetic field. The main tank has an interior volume greater than an interior volume of the metering tank. Method 900 further includes coupling 904 the thermosyphon tube with the magnet such that the thermosyphon tube is in thermal contact with the magnet. Method 900 also includes defining 906 a path along which the cryogen flows by coupling the main tank with the metering tank and coupling an end of the thermosyphon tube with the main tank and the other end of the thermosyphon tube with the metering tank.

At least one technical effect of the systems and methods described herein includes (a) a switch assembly of a magnet assembly that reduces cryogen boiloff during ramping, (b) a switch assembly that reduces the time for switching, (c) a pressure valve configured to operate at a cryogenic temperature and in the presence of magnetic field, (d) a pressure valve that is pressure actuated, (d) a hybrid magnet assembly that has a reduced cryogen consumption, e) a hybrid magnet assembly configurable to be an open system or a sealed system and reconfigurable between the two types of systems, f) a hybrid magnet assembly that eliminates a vent pipe during a quench or a partial quench, g) a hybrid magnet assembly that eliminates a need for cooldown at site, e) a hybrid magnet assembly that has an increased ride through time, f) a hybrid magnet assembly that eliminates the need of external power supply or backup equipment when configured as a low-cryogen magnet assembly.

Exemplary embodiments of switch assemblies and superconducting magnet assemblies and methods of assembling and operation are described above in detail. The assemblies and methods are not limited to the specific embodiments described herein but, rather, components of the assemblies and/or operations of the methods may be utilized independently and separately from other components and/or operations described herein. Further, the described components and/or operations may also be defined in, or used in combination with, other assemblies, methods, and/or devices, and are not limited to practice with only the assemblies described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A superconducting magnet assembly, comprising:
   a magnet; and
   a switch assembly coupled to the magnet, comprising:
      a thermosyphon tube configured to carry cryogen therethrough; and
      a switch configured to switch between a resistive mode and a superconducting mode, wherein the switch is in thermal contact with the thermosyphon tube; and
      a first pressure valve and a second pressure valve,
      wherein the first pressure valve and the second pressure valve are positioned on the thermosyphon tube and configured to control flow of the cryogen in the thermosyphon tube, and the switch is positioned between the first pressure valve and the second pressure valve,
   wherein the magnet is configured to generate a polarizing magnetic field based on switching of the switch between the resistive mode and the superconducting mode.

2. The superconducting magnet assembly of claim 1, wherein the magnet is bathed in the cryogen.

3. The superconducting magnet assembly of claim 1, wherein the thermosyphon tube contains the cryogen, and the thermosyphon tube is in contact with the magnet and configured to cool the magnet.

4. The superconducting magnet assembly of claim 1, wherein the superconducting magnet assembly is configured as a sealed system.

5. The superconducting magnet assembly of claim 1, wherein the superconducting magnet assembly comprises a main tank and a metering tank, the main tank and the metering tank configured to contain the cryogen.

6. A switch assembly of a superconducting magnet assembly, comprising:
- a thermosyphon tube configured to carry cryogen therethrough;
- a switch configured to switch between a resistive mode and a superconducting mode, wherein the switch is in thermal contact with the thermosyphon tube; and
- a first pressure valve and a second pressure valve,
- wherein the first pressure valve and the second pressure valve are positioned on the thermosyphon tube and configured to control flow of the cryogen in the thermosyphon tube, and the switch is positioned between the first pressure valve and the second pressure valve.

7. The switch assembly of claim 6, wherein the first pressure valve comprises:
- a valve head defining a gas chamber;
- a bellows assembly in communication with the gas chamber; and
- a plunger extending from the bellows assembly.

8. The switch assembly of claim 7, wherein the plunger has an exterior shape of a cone or a conical frustum.

9. The switch assembly of claim 7, wherein the thermosyphon tube includes a tube wall, the first pressure valve coupled with the tube wall at a first side of the tube wall, and the tube wall defining an opening at a second side opposite the first side and sized to receive at least a portion of the plunger.

10. The switch assembly of claim 7, wherein the plunger is fabricated with a material having a relatively low thermal conductivity.

11. The switch assembly of claim 10, wherein the material is polytetrafluoroethylene and/or G-10.

12. The switch assembly of claim 6, further comprising a thermal interface positioned between the switch and the thermosyphon tube.

13. The switch assembly of claim 12, further comprising a cryogen gas loop extending from the thermal interface and in thermal contact with a cold head of the superconducting magnet assembly.

14. The switch assembly of claim 12, wherein the first pressure valve is in thermal contact with the thermal interface via a first thermal link.

15. The switch assembly of claim 12, wherein the second pressure valve is in thermal contact with the thermal interface via a second thermal link.

* * * * *